(12) United States Patent
Mandal et al.

(10) Patent No.: US 9,541,657 B2
(45) Date of Patent: Jan. 10, 2017

(54) METHOD OF CONTROLLED PULSE DRIVING OF A STACKED PZT BENDER BAR FOR DIPOLE ACOUSTIC RADIATION

(75) Inventors: Batakrishna Mandal, Missouri City, TX (US); Chen Li, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 558 days.

(21) Appl. No.: 13/821,847

(22) PCT Filed: Sep. 9, 2011

(86) PCT No.: PCT/US2011/051083
§ 371 (c)(1),
(2), (4) Date: Mar. 8, 2013

(87) PCT Pub. No.: WO2012/034071
PCT Pub. Date: Mar. 15, 2012

(65) Prior Publication Data
US 2013/0163387 A1    Jun. 27, 2013

Related U.S. Application Data

(60) Provisional application No. 61/381,843, filed on Sep. 10, 2011.

(51) Int. Cl.
*G01V 1/06* (2006.01)
*G01V 1/02* (2006.01)
(Continued)

(52) U.S. Cl.
CPC .............. *G01V 1/159* (2013.01); *H01L 41/04* (2013.01); *H01L 41/042* (2013.01); *H01L 41/0933* (2013.01)

(58) Field of Classification Search
USPC .......................................... 367/140
See application file for complete search history.

(56) References Cited

U.S. PATENT DOCUMENTS

| | | | |
|---|---|---|---|
| 4,047,060 A | 9/1977 | Schafft | |
| 4,443,731 A * | 4/1984 | Butler | B06B 1/06 310/26 |

(Continued)

FOREIGN PATENT DOCUMENTS

| | | | |
|---|---|---|---|
| GB | 2329514 A | 3/1999 | |
| WO | WO 9524977 A2 * | 9/1995 | B06B 1/0603 |
| WO | WO 2012/034071 A1 | 3/2012 | |

OTHER PUBLICATIONS

International Search Report and Written Opinion of the International Searching Authority issued in Application No. PCT/US2011/051083, date of mailing Jan. 6, 2012, 17 pages.

(Continued)

*Primary Examiner* — James Hulka
(74) *Attorney, Agent, or Firm* — Haynes and Boone, LLP

(57) ABSTRACT

A bender bar is presented. The bender bar includes at least two pairs of piezoelectric elements arranged on an inert element to adjust the response frequency of the bender bar. In some embodiments, the piezoelectric elements can be stacked on the inert element. In some embodiments, the piezoelectric elements are symmetrically arranged with respect to the bender bar such that a gap is formed between piezoelectric elements arranged on the inert element.

12 Claims, 19 Drawing Sheets

(51) Int. Cl.
*H01L 41/04* (2006.01)
*H01L 41/09* (2006.01)

(56) References Cited

U.S. PATENT DOCUMENTS

| | | | |
|---|---|---|---|
| 4,782,910 A | 11/1988 | Sims | |
| 5,001,681 A | 3/1991 | Bertoldi et al. | |
| 5,109,698 A | 5/1992 | Owen | |
| 5,225,731 A | 7/1993 | Owen | |
| 5,367,500 A | 11/1994 | Ng | |
| 6,291,930 B1 | 9/2001 | Sager | |
| 6,661,737 B2 | 12/2003 | Wisniewski et al. | |
| 6,833,656 B2 * | 12/2004 | Hooley | H04R 17/00 310/328 |
| 6,909,666 B2 * | 6/2005 | Dubinsky | G01V 1/44 181/105 |
| 7,692,363 B2 | 4/2010 | Butler et al. | |
| 8,248,750 B2 * | 8/2012 | Biggs | H01L 41/0986 310/311 |
| 8,836,792 B1 * | 9/2014 | Butler | H04R 1/40 348/163 |
| 2004/0017129 A1 | 1/2004 | Hooley et al. | |
| 2004/0257912 A1 | 12/2004 | Dubinsky et al. | |
| 2009/0154053 A1 | 6/2009 | Biggs et al. | |

OTHER PUBLICATIONS

Harrison, A. R. et al., Acquisition and Analysis of Sonic Waveforms From a Borehold Monopole and Dipole Source, SPE20557, pp. 267-282, Sep. 1990.

Kimball, C. V., et al., Semblance Processing of Borehole Acoustic Array Data, Geophysics, vol. 49, pp. 274-281, Mar. 1984.

Kurkjian, A., et al., Slowness Estimation from Sonic Logging Waveforms, Geoexploration, vol. 277, pp. 215-256, 1991.

Morris, C.F. et al., A New Sonic Array Tool for Full Waveform Logging, SPE-13285, Society of Petroleum Engineers, 1984.

European Search Report, Jul. 24, 2014, EP 11824204.9-1564, 6 pages.

International Search Report and the Written Opinion of the International Searching Authority, or the Declaration, Jul. 9, 2014, PCT/US2014/016102, 11 pages, International Searching Authority, U.S.

Mexican Office Action, Mar. 24, 2014, MX/a/2013/002680. 2 pages.

* cited by examiner

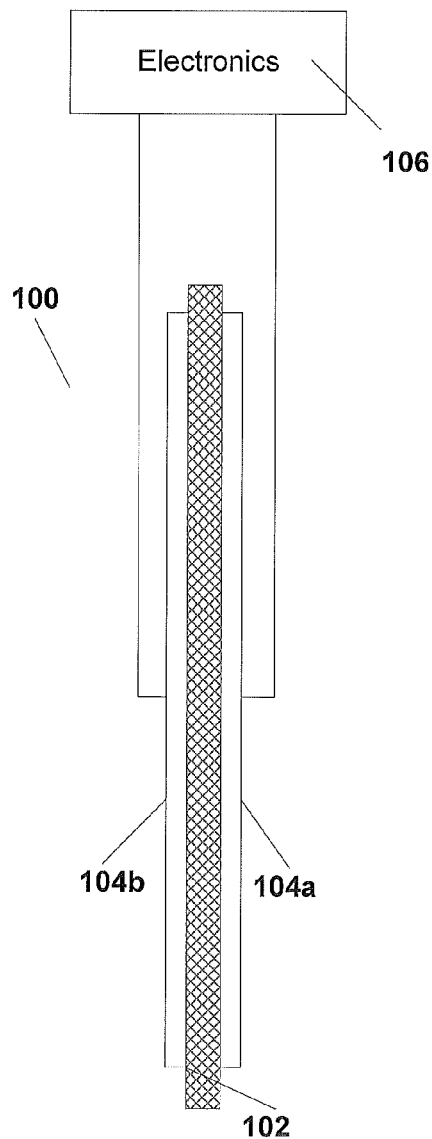
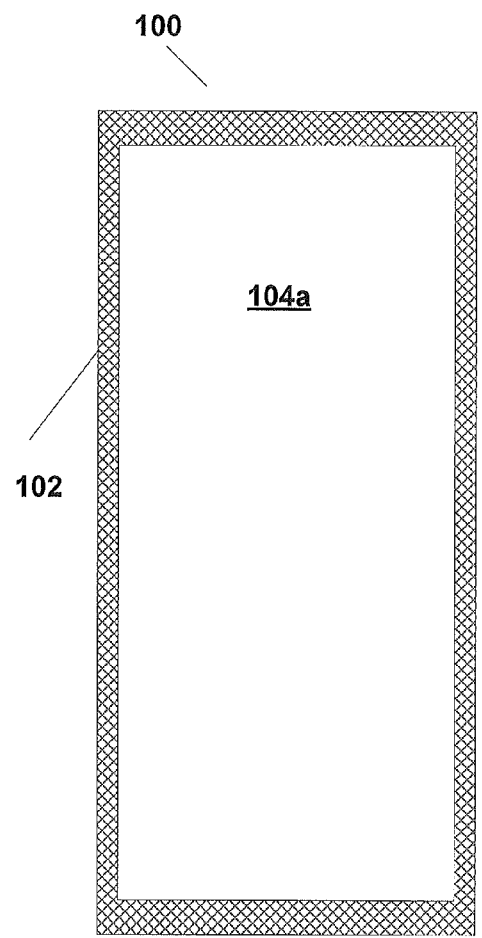
Figure 1A
Figure 1B

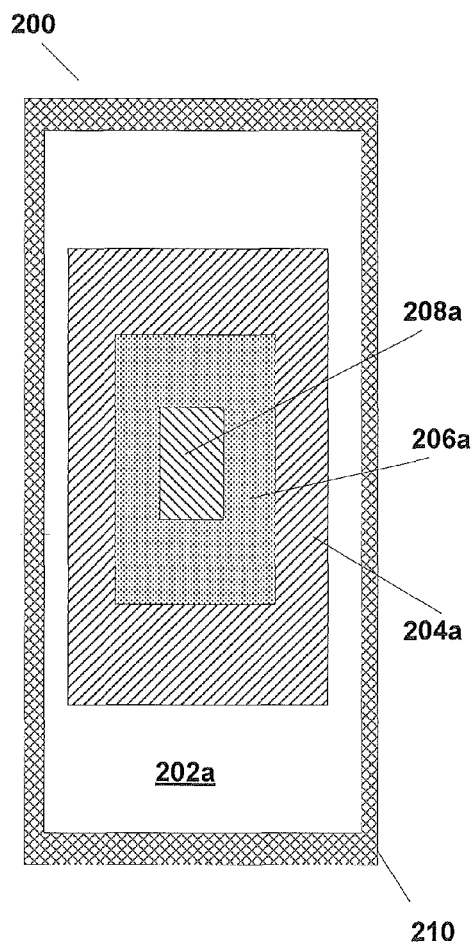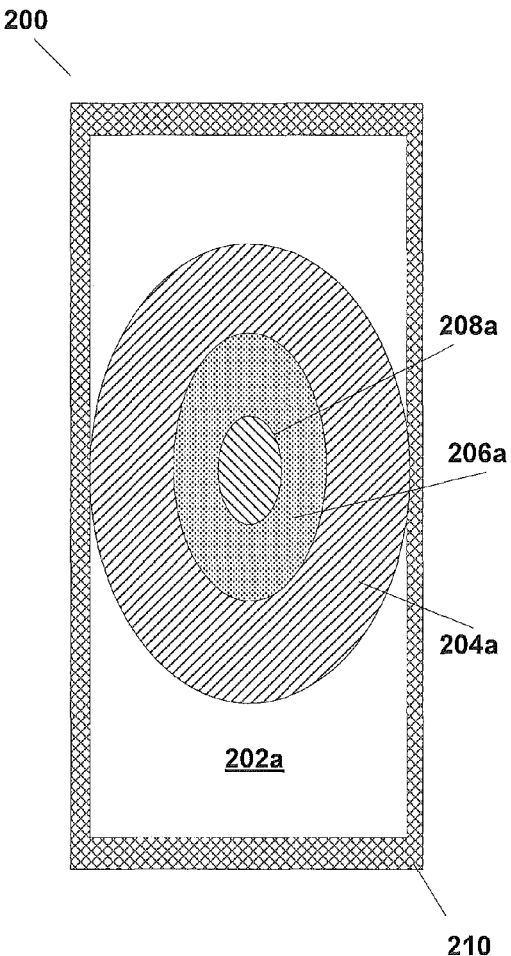
Figure 2C
Figure 2D

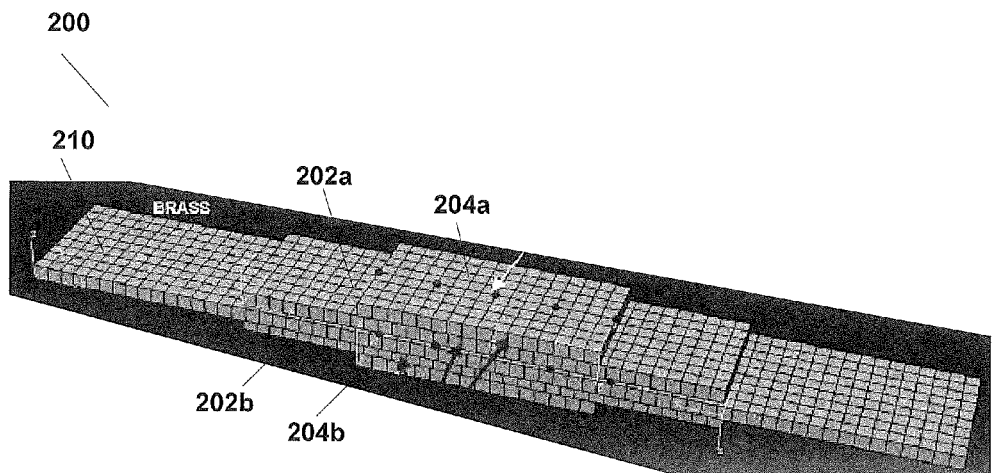
Figure 8
 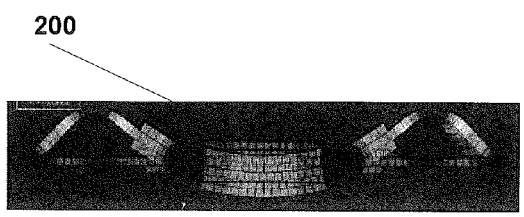
Figure 9A  Figure 9B

1400

1400

1400

METHOD OF CONTROLLED PULSE DRIVING OF A STACKED PZT BENDER BAR FOR DIPOLE ACOUSTIC RADIATION

RELATED APPLICATIONS

The present application claims priority to U.S. Provisional Patent Application 61/381,843, filed on Sep. 10, 2010, which is herein incorporated by reference in its entirety.

TECHNICAL FIELD

The present invention relates to construction and control of a PZT bender bar for dipole acoustic radiation.

DISCUSSION OF RELATED ART

Bender bars are utilized, for example, in wireline logging tools. Such bender bar transducers can be utilized to either detect or to generate acoustic vibrations. In many cases, especially with wireline logging tools, bender bar transducers are utilized to detect seismic waves.

Acoustic well logging is a well-developed art, and details of acoustic logging tools and techniques are set forth in A. Kurkjian, et al., "Slowness Estimation from Sonic Logging Waveforms", Geoexploration, Vol. 277, pp. 215-256 (1991); C. F. Morris et al., "A New Sonic Array Tool for Full Waveform Logging," SPE-13285, Society of Petroleum Engineers (1984); A. R. Harrison et al., "Acquisition and Analysis of Sonic Waveforms From a Borehole Monopole and Dipole Source . . . " SPE 20557, pp. 267-282 (September 1990); and C. V. Kimball and T. L. Marzetta, "Semblance Processing of Borehole Acoustic Array Data", Geophysics, Vol. 49, pp. 274-281 (March 1984), all of which are hereby incorporated by reference herein in their entirety. An example of an acoustic logging tool is provided in U.S. Pat. No. 6,661,737, which is herein incorporated by reference in its entirety.

An acoustic logging tool typically includes an acoustic source (transmitter), and a set of receivers that are spaced several inches or feet apart. An acoustic signal is transmitted by the acoustic source and received at the receivers of the borehole tool which are spaced apart from the acoustic source. Measurements are repeated every few inches as the tool passes along the borehole. The acoustic signal from the source travels through the formation adjacent the borehole to the receiver array, and the arrival times and perhaps other characteristics of the receiver responses are recorded.

Typically, compressional wave (P-wave), shear wave (S-wave), and Stoneley wave arrivals and waveforms are detected by the receivers and are processed. The processing of the data is often performed on the surface, although it may also be performed real time in the tool itself. Regardless, the information that is recorded is typically used to determine formation characteristics such as formation slowness (the inverse of acoustic speed) and anisotropy, from which pore pressure, porosity, and other formation property determinations can be made. With some tools, the acoustic signals may even be used to image the formation.

Acoustic logging tools are used for both wireline logging and logging while drilling (LWD) applications. In wireline logging, a probe, or "sonde", housing multiple logging tools is lowered into the borehole after some or all of the well has been drilled. The sonde is attached to a conductive wireline that carries power from the surface to the tools in the sonde, and that carries telemetry information to the surface. The sonde may be transported through the borehole by the wireline, or a separate transport means may be provided. For example, in "pipe-conveyed" logging, the sonde is mounted on a tubing string. The rigidity of the tubing string allows the sonde to be transported through highly deviated and horizontal boreholes.

The problem with obtaining downhole measurements via wireline is that the drilling assembly must be removed or "tripped" from the drilled borehole before the desired borehole information can be obtained. This can be both time-consuming and extremely costly, especially in situations where a substantial portion of the well has been drilled. In this situation, thousands of feet of tubing may need to be removed and stacked on the platform (if offshore). Typically, drilling rigs are rented by the day at a substantial cost. Consequently, the cost of drilling a well is directly proportional to the time required to complete the drilling process. Removing thousands of feet of tubing to insert a wireline logging tool can be an expensive proposition.

As a result, there is a strong incentive to minimize the number of wireline logging trips. One way to do this involves collection of data during the drilling process. Designs for measuring conditions downhole including the movement and location of the drilling assembly contemporaneously with the drilling of the well have come to be known as "measurement-while-drilling" techniques, or "MWD" Similar techniques, concentrating more on the measurement of formation parameters, commonly have been referred to as "logging while drilling" techniques, or "LWD". While distinctions between MWD and LWD may exist, the terms MWD and LWD often are used interchangeably. For the purposes of this disclosure, the term LWD will be used with the understanding that this term encompasses both the collection of formation parameters and the collection of information relating to the movement and position of the drilling assembly.

LWD tools are generally located as close to the drill bit as possible, so as to minimize the delay between reaching a formation and measuring its properties. When implemented as LWD tools, acoustic logging tools must overcome a number of obstacles to perform successfully. These obstacles include drilling noise, and acoustic properties of the thick tool body.

Bender bars can be utilized in both the transmitter portion and the receiver portion of the acoustic logging tool. However, current bender bars have difficulties with low frequency responses, resulting in difficulties in producing high quality logs for large hole and soft formation applications.

Therefore, there is a need to develop better performing bender bars.

SUMMARY

In accordance with aspects of the present invention, a bender bar is presented. A bender bar according to some embodiments of the present invention includes an inert element and at least two pairs of piezoelectric elements coupled to the inert element. In some embodiments, the at least two pairs of piezoelectric elements are arranged in a symmetric fashion with respect to the inert element.

In some embodiments, a method of adjusting a frequency response of a bender bar includes arranging at least two pairs of piezoelectric elements to an inert element. In some embodiments, arranging the at least two pairs of piezoelectric elements includes arranging the elements in a symmetrical fashion with respect to the inert element. In some embodiments, the inert element is a bar having a length, a width, and a thickness, the bar having a first side and a second side, and arranging the at least two pairs of piezoelectric elements includes attaching one of a first pair of piezoelectric elements on the first side and attaching one of the first pair of piezoelectric elements on the second side, and attaching one of a second pair of piezoelectric elements on the first side and attaching one of the second pair of piezoelectric elements on the second side. In some embodiments, attaching the first pair of piezoelectric elements includes bonding each of the first pair of piezoelectric elements to the inert element and attaching the second pair of piezoelectric elements includes bonding each of the second pair of piezoelectric elements to one of the first pair of piezoelectric elements. In some embodiments, attaching the first pair of piezoelectric elements includes bonding each of the first pair of piezoelectric elements to the inert element and attaching the second pair of piezoelectric elements includes bonding each of the second pair of piezoelectric elements to the inert element in a way that forms a gap between each of the first pair of elements and one of the second pair of elements. In some embodiments, a third pair of piezoelectric elements can be bonded to one of the first pair of piezoelectric elements and a fourth pair of piezoelectric elements can be bonded to one of the second pair of piezoelectric elements.

These and other embodiments are further discussed below with respect to the following figures.

BRIEF DESCRIPTION OF THE DRAWINGS

FIGS. 1A and 1B illustrate a basic bender bar.

FIGS. 2A, 2B, 2C, and 2D illustrate example embodiments of a stacked bender bar according to some aspects of the present invention.

FIG. 8 illustrates a particular example of a stacked bender bar such as that illustrated in FIGS. 2A and 2B according to some embodiments of the present invention.

FIGS. 9A, 9B, and 9C illustrate three symmetric modes of the stacked bender bar illustrated in FIG. 8.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other element that, although not specifically described here, is within the scope and the spirit of this disclosure.

Present Halliburton Dipole wireline logging tool (WaveSonic/SloWave) lacks a low frequency dipole source, which provides difficulty in producing a high quality log for large hole and soft formation applications. Presently, the Halliburton dipole sonic tool uses the Mobil Oil technology source utilizing a bi-polar bender transducer as described in U.S. Pat. No. 4,782,910 and drivers as described in U.S. Pat. No. 6,661,737, which is herein incorporated by reference in its entirety, to drive the transducer.

FIGS. 1A and 1B illustrate a bender bar transducer 100 as described in U.S. Pat. No. 4,782,910. As shown in the cross-sectional view of FIG. 1A, transducer 100 includes piezoelectric elements 104a and 104b mounted on an inert element 102. Inert element may be, for example, aluminum or some other suitable non-piezoelectric element. As shown in FIG. 1B, piezoelectric elements 104a and 104b are slabs of mater that are mounted on inert element 102. As shown in FIG. 1A, the piezoelectric elements of piezoelectric elements 104a and 104b are electrically coupled to electronics 106. Electronics 106 may include driver circuits or receiver elements such as that illustrated, for example, in U.S. Pat. No. 6,661,737. As described in U.S. Pat. No. 4,782,910, transducer 100 provides a bi-polar acoustic wave as it is driven by electronics 106.

Figure 2A:
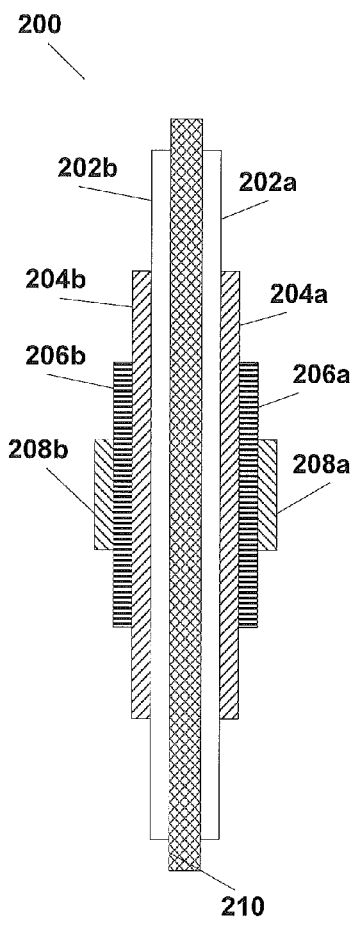

FIGS. 2A, 2B, 2C, and 2D illustrate some embodiments of a bender bar transducer 200 according to aspects of the present invention. As shown in FIG. 2A, bender bar transducer 200 includes an inert element 210. Multiple piezoelectric slabs are mounted in layers on each side of inert element 210 to form a stacked bender bar. As shown in the particular example illustrated in FIG. 2A, piezoelectric elements 202a and 202b are mounted on opposite sides of inert element 210. Piezoelectric element 204a is mounted on piezoelectric element 202a and piezoelectric element 204b is mounted on piezoelectric element 202b. Piezoelectric element 206a is mounted on piezoelectric element 204a and piezoelectric element 206b is mounted on piezoelectric element 204b. Piezoelectric element 208a is mounted on piezoelectric element 206a and piezoelectric element 208b is mounted on piezoelectric element 206b.

FIGS. 2A, 2B, 2C and 2D specifically illustrate an example embodiment with three pairs of stacked piezoelectric elements—piezoelectric elements 204a and 204b, 206a and 206b, and 208a and 208b. Any number of pairs of piezoelectric elements can be utilized. The example illustrated in FIGS. 2A, 2B, 2C, and 2D are exemplary only.

Inert element 210 can be any element that is not piezoelectric in nature. For example, inert element 120 can be Al, brass, titanium, or any metal or alloy. Piezoelectric elements 202a, 202b, 204a, 204b, 206a, 206b, 208a, and 208b can be any piezoelectric elements, for example lead zirconate titanate (PZT), bariom titanate (BaTiO$_3$), Gallium orthophosphate (GaPO$_4$), Tourmaline, Quartz, or other piezoelectric material. As shown in FIG. 2A, pairs of piezoelectric elements—piezoelectric elements 202a, 202b; 204a, 204b; 206a, 206b; and 208a, 208b—are stacked. Each layer of piezoelectric element in the stacking can have different thicknesses and can have differing widths and lengths. For purposes of this disclosure, thickness refers to the dimension perpendicular to the largest planar surface of inert element 210, the surfaces on which piezoelectric element 202a and 202b are mounted, and the length and width refer to dimensions in the plane of inert element 210. The various layers of piezoelectric element are differently sized and may be of different types of piezoelectric elements in order to better control the response of transducer 200.

Figure 2B:
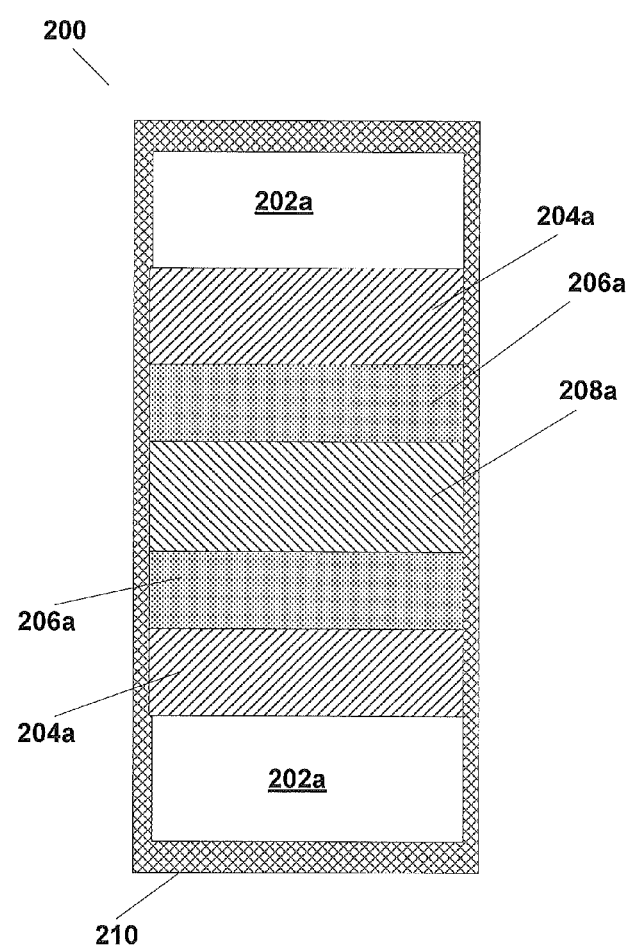

FIG. 2B illustrates an example stacking arrangement of transducer 200. As shown in FIG. 2B, each of piezoelectric elements 202a, 204a, 206a, and 208a are rectangular bars with each of them of different lengths but similar widths. As shown in FIG. 2B, piezoelectric element 202a is mounted to inert element 210 in a symmetric fashion. Piezoelectric element 204a is symmetrically mounted on piezoelectric element 202a. Piezoelectric element 206a is symmetrically mounted on piezoelectric element 204a. Piezoelectric element 208a is symmetrically mounted on piezoelectric element 206a. Piezoelectric elements 202b, 204b, 206b, and 208b are similarly stacked on the opposite side of inert element 210, as is shown in FIG. 2A.

FIG. 2C illustrates another example of a stacking arrangement of transducer 200. As shown in FIG. 2C, each of piezoelectric elements 202a, 204a, 206a, and 208a are rectangular bars having differing dimensions in both length and width. As shown in FIG. 2C, piezoelectric element 202a is symmetrically mounted on inert element 210. Piezoelectric element 204a is symmetrically mounted on piezoelectric element 202a; piezoelectric element 206a is symmetrically mounted on piezoelectric element 204a; and piezoelectric element 208a is symmetrically mounted on piezoelectric element 206a. Piezoelectric elements 202b, 204b, 206b, and 208b are the same sizes as piezoelectric elements 202a, 204a, 206a, and 208a and are similarly arranged on the opposite side of inert element 210.

FIG. 2D illustrates another example of a stacking arrangement of transducer 200. As shown in FIG. 2C, only piezoelectric element 202a is rectangular in shape. Piezoelectric elements 204a, 206a, and 208a are elliptical slabs in shape, with the minor and major axis of the ellipse corresponding to width and length directions, respectively. As shown in FIG. 2C, each of the elliptical layers 204a, 206a, and 208a are of different sizes. Further, piezoelectric element 202a is symmetrically mounted on inert element 210. Piezoelectric element 204a is symmetrically mounted on piezoelectric element 202a; piezoelectric element 206a is symmetrically mounted on piezoelectric element 204a; and piezoelectric element 208a is symmetrically mounted on piezoelectric element 206a. Piezoelectric elements 202b, 204b, 206b, and 208b are the same sizes and shapes as piezoelectric elements 202a, 204a, 206a, and 208a and similarly arranged on the opposite side of inert element 210.

The stacked piezoelectric element pairs 204a and 204b, 206a and 206b, and 208a and 208b can provide mass loading to the dipole at the center of maximum bending. This mass loading forces the frequency response of transducer 200 toward lower frequencies and lowers the quality factor Q. A similar effect was attempted and disclosed in U.S. Pat. No. 7,692,363, however the mass loading proposed in that disclosure was not capable of being driven.

Figure 3:
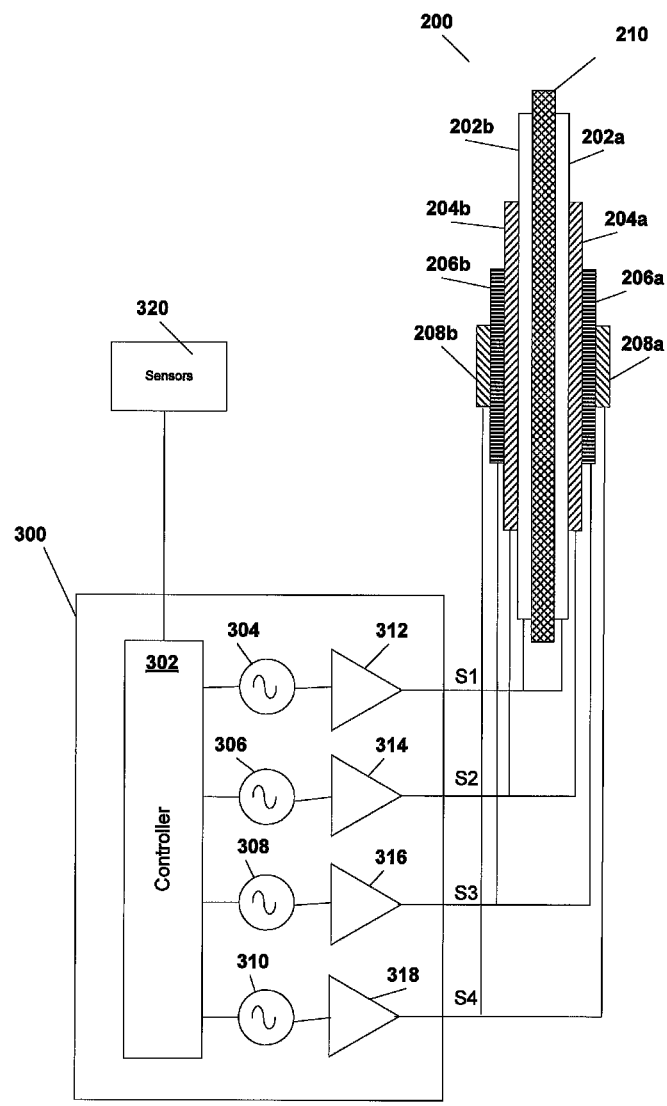
FIG. 3 illustrates a schematic for driving bipolar elements of stacked bender bars such as those illustrated in FIGS. 2A, 2B, 2C, and 2D.

In accordance with some embodiments of the present invention, each of piezoelectric element pairs 202a and 202b, 204a and 204b, 206a and 206b, and 208a and 208b can be independently driven with controlled pulses to enhance further the low frequency response of transducer 200. FIG. 3 illustrates a schematic of a driver 300 for driving each bipolar element, a bipolar element being formed by each of the piezoelectric element pairs. In some embodiments, individual (unipolar) elements (formed by individual ones of piezoelectric elements) can be driven separately by driver circuit 300 to achieve asymmetric acoustic radiation.

The embodiment of driver circuit 300 illustrated in FIG. 3 is a bipolar driver where individual piezoelectric pairs (piezoelectric element 202a and 202b; 204a and 204b; 206a and 206b; and 208a and 208b) are driven simultaneously and synchronously. As shown in FIG. 3, driver 300 includes a controller 302 that controls pulse generators 304, 306, 308, and 310. Pulse generator 304 is coupled through a driver 312 to produce signal S1, which is coupled to drive piezoelectric element 202a and 202b. Pulse generator 306 is coupled through a driver 314 to produce signal S2, which is coupled to drive piezoelectric element 204a and 204b. Pulse generator 308 is coupled through a driver 316 to produce signal S3, which is coupled to drive piezoelectric element 206a and 206b. Pulse generator 310 is coupled through a driver 318 to produce signal S4, which is coupled to drive piezoelectric element 208a and 208b.

In some embodiments of the present invention, output signals produced by transducer 200 can be detected by sensors 320. Signals from sensors 320 can be input to controller 302, which can then adjust the signals S1, S2, S3, and S4 supplied to transducer 200 to provide desirable results. One such desirable result can be, for example, enhancing the dipole nature of transducer 200 and the suppression of other modes of vibration.

Figure 4A:
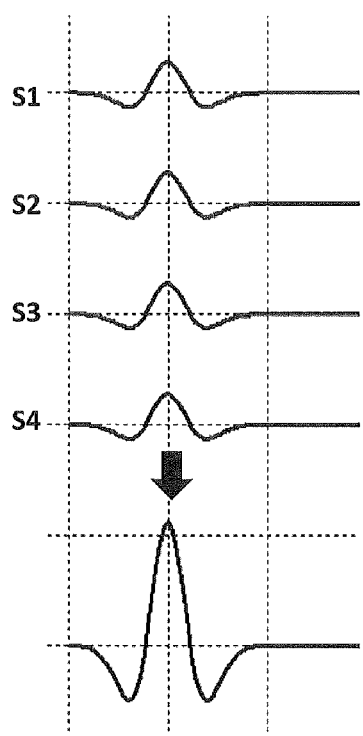
FIGS. 4A, 4B, and 4C illustrate the results of driving the bipolar elements of an example stacked bender bar under different impulse characteristics.
Figure 4B:
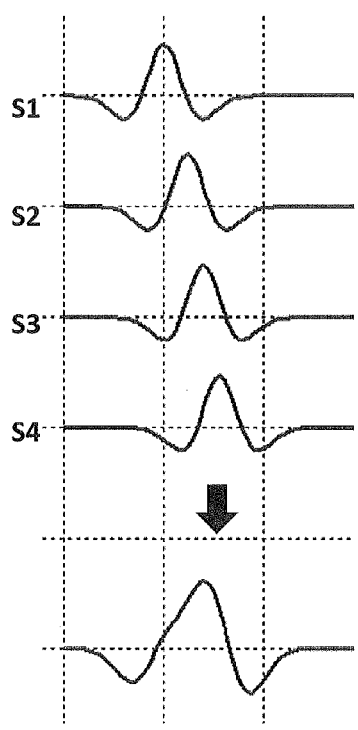
Figure 4C:
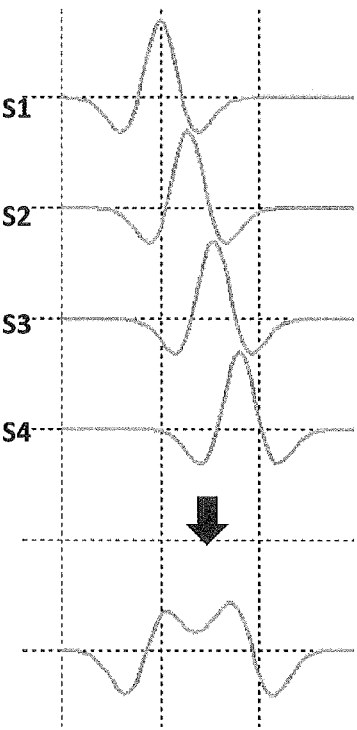

FIGS. 4A, 4B, and 4C illustrate the results of different driving pulses for S1, S2, S3, and S4. As shown in FIG. 4A, signals S1, S2, S3, and S4 that are in phase with one another will add to the effect and produce a large signal. FIG. 4B illustrates the effects of shifting signals S1, S2, S3, and S4 in phase with respect to one another. As shown in FIG. 4B, the resulting output signal is broader. As shown in FIG. 4C, as the phase between the impulses S1, S2, S3, and S4 are increased, the resulting output signal becomes more diffuse.

Some embodiments of transducer 200 can experience larger displacements due to the stacking of piezoelectric elements, resulting in mass loading as well as the ability to drive multiple pairs of piezoelectric elements. The overall thickness of the stacking and resulting mass loading can also result in a lower frequency response and a lower Q. Controlling the pulses to each of the piezoelectric element pairs in frequency, amplitude, and shape can produce much lower or higher frequency responses with larger displacements. The displacements, as illustrated above, can be controlled by adjusting the phasing between individual signals supplied to the piezoelectric element pairs. In some embodiments, controlling pulse signals to individual pairs of piezoelectric elements can also be used to equalize the dipole displacement at both sides and thereby minimize Stoneley mode generation (generation of waves that travel along the wellbore). This effectively enhances a pure dipole signal output signal and increases the dipole signal-to-noise (S/N). In some embodiments of the present invention, numerous adaptive pulse controls produced by monitoring the output signals can be added to improve the dipole quality of the output signals produced by transducer 200.

Performance of a basic bender bar 100 with an embodiment of a stacked bender bar 200 were modeled and compared with utilizing a WaveSonic™ (Halliburton Acousitc logging tool) dipole source, which can include transmitter driving circuit board part no 101507949 and Wireline Tool part no 101378058 manufactured by Halliburton). The performance of the bender bar was modeled and analyzed utilizing a multiphysics modeling package by COMSOL, Inc. (COMSOL) and a second package by Simulia, Inc., called the ABAQUS software packages (ABAQUS). Both COMSOL and ABAQUS are finite element multi-physics modeling packages.

It was found that the COMSOL package is not stable and could not produce any dynamic response. As a result, only ABAQUS modeling results are presented in this disclosure. The software package ABAQUS is capable of performing several kinds of analysis to give insight to the performance of a bender bar. These analyses include Natural Frequency Extraction, Direct-Solution Steady-State Dynamic Analysis, and Implicit Dynamic Analysis using Direct Integration. The response was modeled without loading (no surrounding medium). The proposed concepts of this discloser are verifiable utilizing this software and the results are provided below.

Figure 5:
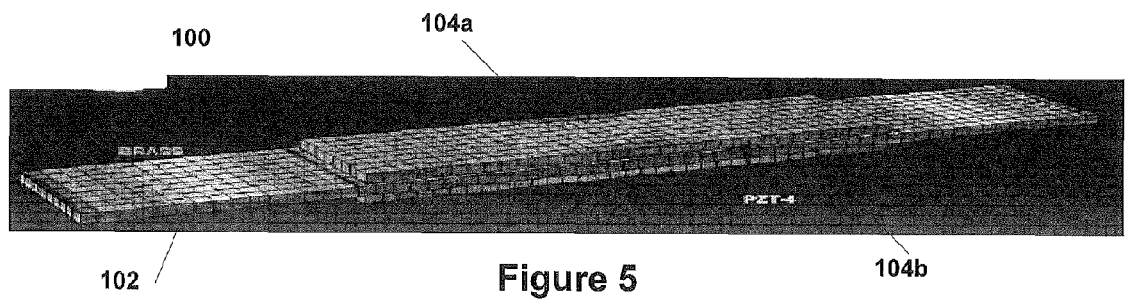
FIG. 5 illustrates a particular example of a basic bender bar as shown in FIG. 1.

FIG. 5 illustrates a particular example of bender bar 100 that is utilized for analysis as discussed above. In this analysis, bender bar 100 is a PZT bender bar. Specifically, inert element 102 is a brass plate of thickness 0.125 inch, length 7.7 inch, and width 1.1 inch. Piezoelectric elements 104a and 104b are PZT crystal (C5400 or PZT-4 that may be purchased, for example, from Channel Industries or Piezo Technologies). Each of Piezoelectric elements 104a and 104b has a thickness of 0.125 inch, length of 4.0 inch, and width of 1.0 inch. Piezoelectric elements 104a and 104b are bonded to inert element 102, for example, with epoxy or a resin.

Natural Frequency Extraction (Modal analysis) is performed utilizing the particular example of bender bar 100 illustrated in FIG. 5 to calculate the natural frequencies and the corresponding mode shapes of bender bar 100. The ABAQUS model utilizes an eigenvalue analysis to find the various modes and mode frequencies. For the WaveSonic™ bender bar model shown in FIG. 5, 14 vibrational modes between 0 and 10 kHz where found. Those modes are listed in Table 1. The more important modes are the symmetric modes, which for bender bar 100 of FIG. 5 are listed as mode 1 at 383.6 Hz, mode 5 at 2622.8 Hz, and mode 9 at 5887.7 Hz, which are themselves illustrated in FIGS. 6A, 6B, and 6C, respectively. The harmonic displacement of the center point is illustrated in FIG. 7 as a function of frequency.

Figure 6A:
FIGS. 6A, 6B, and 6C illustrate three symmetrical harmonic modes for the example bender bar illustrated in FIG. 5.
Figure 6B:
Figure 6C:

Bender bar 100 can have several types of mode shapes. The various types of bending include, for example, twisting, swinging sidewise, and swinging lengthwise. Among these, only certain symmetric bending modes provide substantial pressure when bender bar 100 is coupled to an acoustic medium. FIGS. 6A, 6B, and 6C show symmetric bending modes corresponding to the modes at 363.6 Hz, 2622.8 Hz, and 5887.7 Hz, respectively. FIGS. 6A, 6B, and 6C are not to scale and are provided to emphasize the mode shapes only. FIG. 6A shows a mode having no internal nodes. FIG. 6B illustrates a mode having two internal nodes. FIG. 6C shows a mode having 4 internal nodes.

Figure 7:
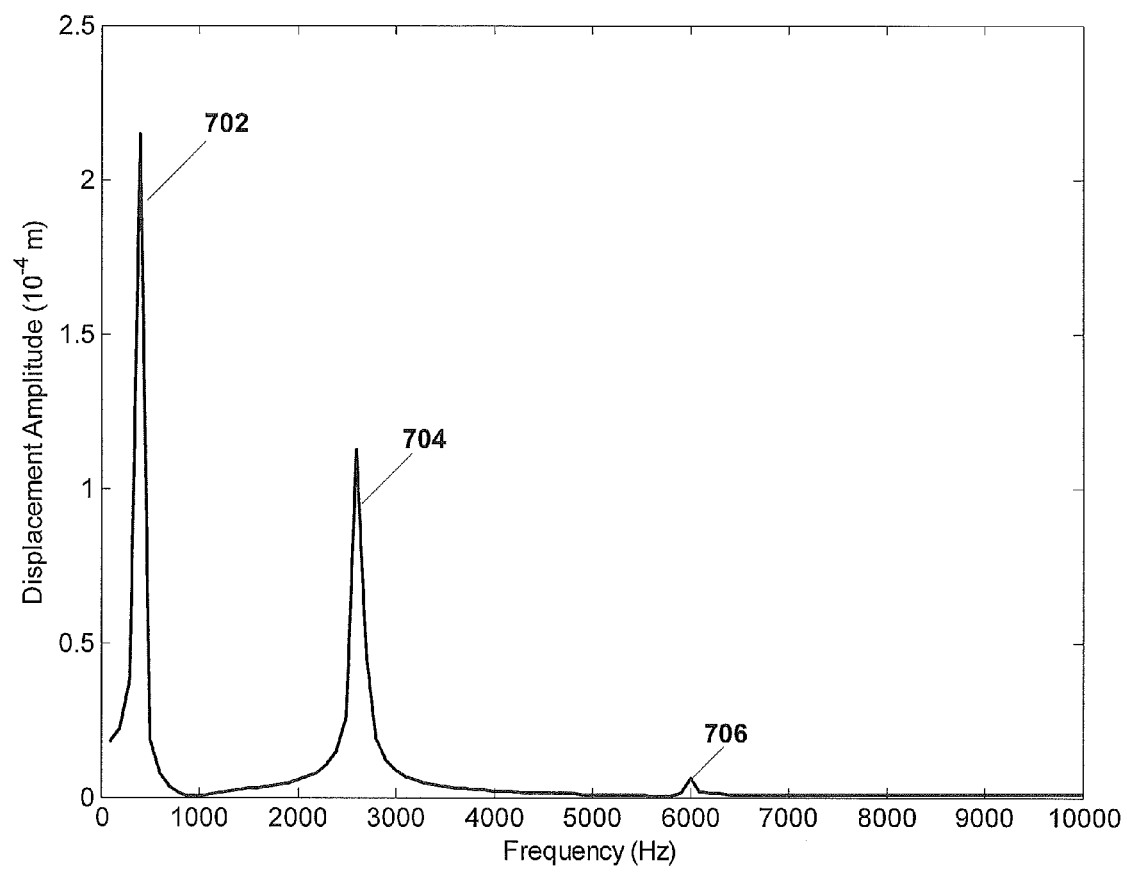
FIG. 7 illustrates the harmonic displacement of the center point of the particular example of bender bar illustrated in FIG. 5.

FIG. 7 shows the harmonic displacement in Z-direction of the center point of the bar. In this model, illustrated in FIG. 7, there is no loading (i.e., no surrounding medium). FIG. 7 illustrates peaks 702, 704, and 706, corresponding to mode 1, mode 5, and mode 9 of Table 1, respectively. The results illustrated in FIG. 7 are based on a theoretical model of the ABAQUS system. FIG. 7 illustrates that peaks 702, 704, and 706 are observed at the symmetrical modes 1, 5, and 9 shown in FIGS. 6A, 6B, and 6C, respectively.

FIG. 8 illustrates a particular example of a stacked bender bar 200 on which frequency calculations can be performed. In the embodiment shown in FIG. 8, stacked bender bar 200 includes inert element 210, piezoelectric elements 202a and 202b and piezoelectric elements 204a and 204b. Inert element 210 and piezoelectric elements 202a and 202b are the same elements and dimensions as inert element 102 and piezoelectric elements 104a and 104b illustrated in FIG. 5. In other words, inert element 210 is a brass plate of thickness 0.125 inch, length 7.7 inch, and width 1.1 inch. Piezoelectric elements 202a and 202b are PZT crystal (C5400 or PZT-4, which may be purchased, for example, from Channel Industries or Piezo Technologies). Each of Piezoelectric elements 202a and 202b has a thickness of 0.125 inch, length of 4.0 inch, and width of 1.0 inch. Piezoelectric elements 202a and 202b are bonded to inert element 210 with an epoxy or resin. Piezoelectric elements 204a and 204b are half sized of piezoelectric elements 202a and 202b, having thickness of 0.125 inch, length of 2.0 inch, and width of 1.0 inch. Piezoelectric elements 204a and 204b are bonded to piezoelectric elements 202a and 202b, respectively, with epoxy or resin.

Figure 9C:
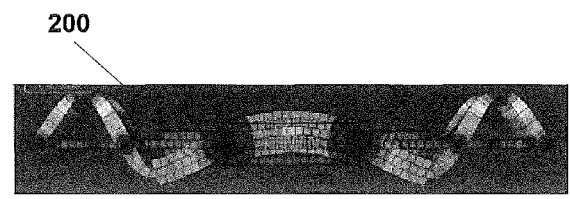
Figure 10:
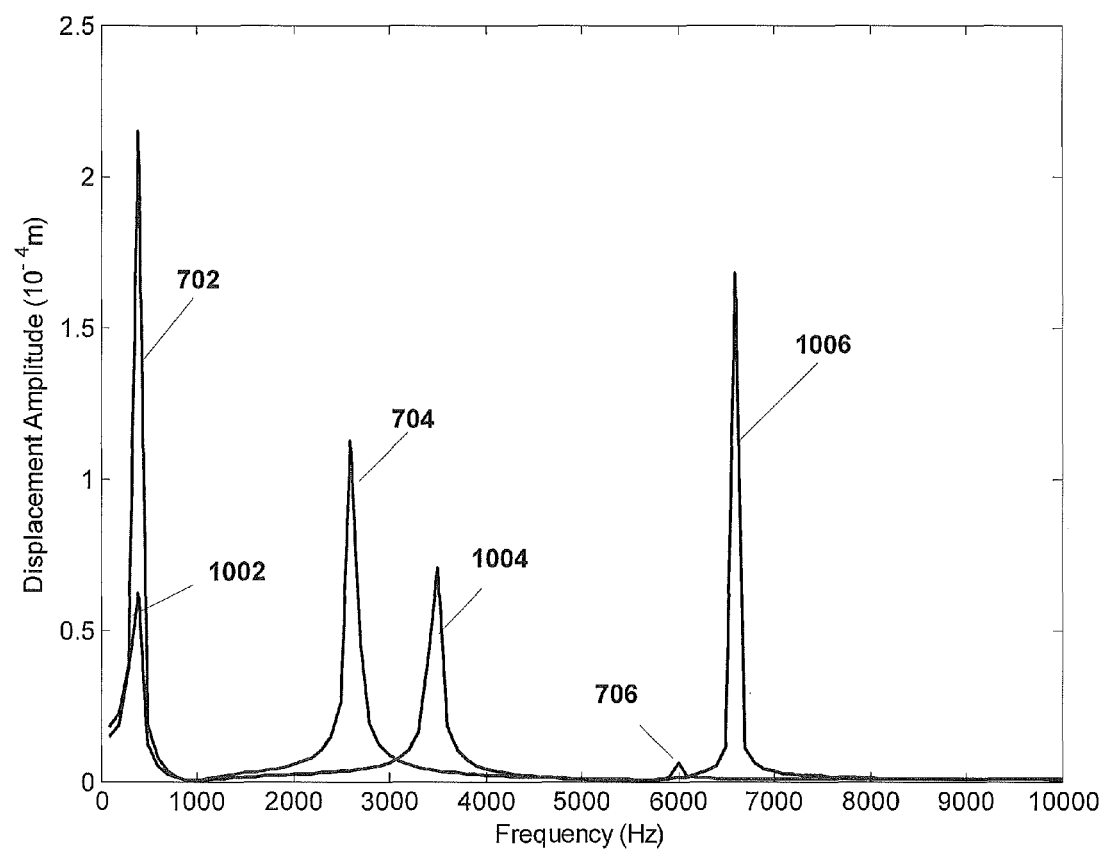
FIG. 10 illustrates a comparison of the harmonic displacement in the Z direction of the stacked bender bar illustrated in FIG. 8 with that of the bender bar illustrated in FIG. 5.

The calculated natural frequencies for stacked bender bar 200 shown in FIG. 8 are given in Table 2. Modes 1, 5, and 10 correspond to three symmetric mode shapes, which are illustrated in FIGS. 9A, 9B, and 9C, respectively. FIG. 10 illustrates the harmonic displacement in Z direction of bender bar 200 illustrated in FIG. 8 compared to those of bender bar 100 illustrated in FIG. 5.

TABLE 1

| Mode | 1 | 2 | 3 | 4 | 5 | 6 | 7 |
|---|---|---|---|---|---|---|---|
| Freq (Hz) | 383.6 | 956.5 | 1009.2 | 1762.6 | 2622.8 | 4709 | 4717 |
| Mode | 8 | 9 | 10 | 11 | 12 | 13 | 14 |
| Freq (Hz) | 5306.4 | 5887.7 | 6290.7 | 6846.6 | 7856.1 | 8217.4 | 9330 |

TABLE 2

| Mode | 1 | 2 | 3 | 4 | 5 | 6 | 7 |
|---|---|---|---|---|---|---|---|
| Freq (Hz) | 367.53 | 856.3 | 944.01 | 1590.7 | 3463.9 | 4567.8 | 4869 |
| Mode | 8 | 9 | 10 | 11 | 12 | 13 | 14 |
| Freq (Hz) | 5518.1 | 6016.1 | 6593.3 | 6738.6 | 9016.2 | 9054.3 | 9334 |

FIGS. 9A, 9B, and 9C show Symmetric bending modes of the example of bender bar 200 illustrated in FIG. 8. In accordance with Table 2, FIG. 9A illustrates mode 1 at 367.53 Hz, FIG. 9B illustrates mode 5 at 3463.9 Hz, and FIG. 9C illustrates mode 10 at 6593.3 Hz. These modes represent the lower frequency symmetric modes of bender bar 200, with mode 1 of bender bar 200 having 0 nodes illustrated in FIG. 9A, with mode 5 of bender bar 200 having 2 nodes illustrated in FIG. 9B, and with mode 10 of bender bar 200 having 4 nodes illustrated in FIG. 9C.

FIG. 10 illustrates the harmonic displacement in the Z-direction of the center point of the example bender bar 200 illustrated in FIG. 8 in comparison with bender bar 100 as illustrated in FIG. 5. Peaks 702, 704, and 706 corresponding to modes 1, 5, and 9, respectively, of bender bar 100 of FIG. 5 are illustrated. Peaks 1002, 1004, and 1006 corresponding to modes 1, 5, and 10, respectively, of bender bar 200 of FIG. 8 are illustrated. As shown in FIG. 10 and Tables 1 and 2, peaks 1004 and 1006 are shifted to higher frequencies while peak 1002 is shifted to a slightly lower frequency.

The stacked bender bar computed results illustrated in FIG. 10 show that the addition of the additional piezoelectric element 204a and 204b, which provides extra mass, did not reduce the frequency response, and instead adjusted the frequency of most of the symmetric modes to higher frequency. The frequency (f) of the modes of a mechanical system is governed by the relation:

$$f \to \sqrt{\frac{k}{m}},$$

where k=stiffness and m=mass. If the mass m increases compared to stiffness k, the frequency will be lower. However, as shown in FIG. 10, it seems the stiffness k is increasing more than the mass in, resulting in an increase in frequency. Therefore, embodiments of the invention as illustrated in FIGS. 2A, 2B, 2C, and 2D and in FIG. 8 can be utilized to shift operating frequencies of bender bars to higher frequencies.

Figure 11A:
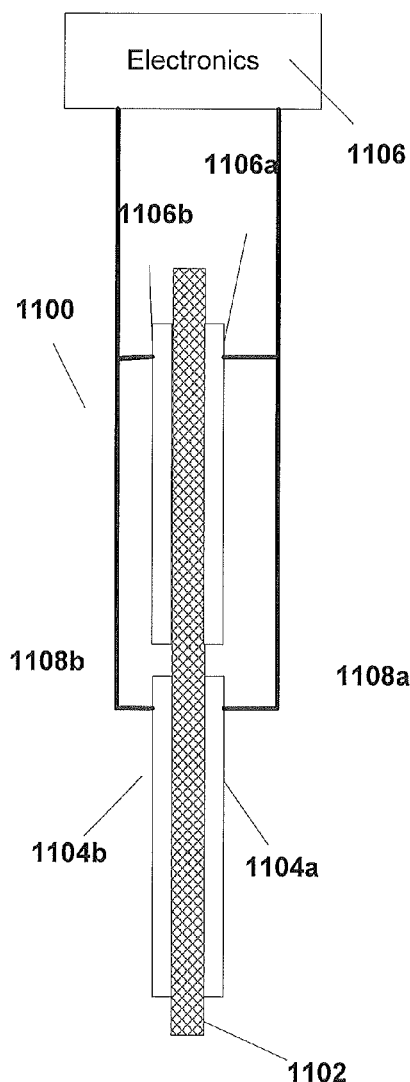
FIGS. 11A and 11B illustrate a bender bar according to some embodiments of the present invention.
Figure 11B:
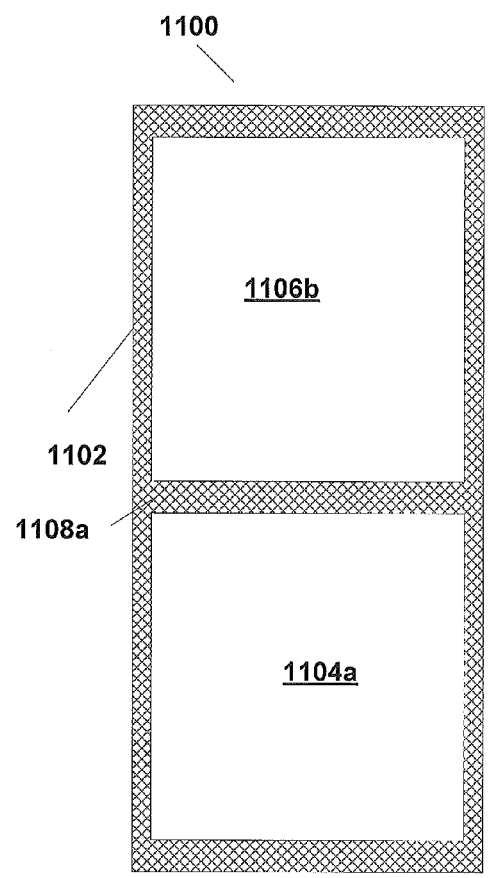
Figure 11C:
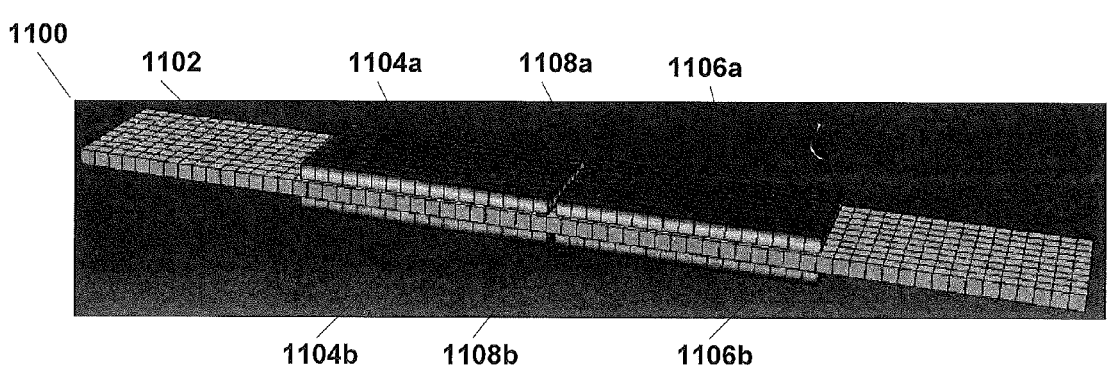
FIG. 11C illustrates a particular example of the bender bar illustrated in FIGS. 11A and 11B.

FIGS. 11A, 11B, and 11C illustrate a bender bar transducer 1100 according to some embodiments of the present invention that may lower the frequency and may provide more power. As shown in FIG. 11, transducer 1100 includes an inert element 1102. Transducer 1100 also includes pairs of piezoelectric elements, piezoelectric elements 1104a and 1104b and piezoelectric elements 1106a and 1106b, bonded to inert element 1102 such that there are gaps 1108a and 1108b at the center point of inert element 1102. Bender bar 1100 is similar to bender bar 100, except that the stiffness k is reduced by stripping off portions of piezoelectric elements 104a and 104b from the middle of bender bar 100 to form piezoelectric elements 1104a and 1104b and 1106a and 1106b.

In a particular example as shown in FIG. 11C, inert element inert element 1102 is a brass plate of thickness 0.125 inch, length 7.7 inch, and width 1.1 inch. Piezoelectric elements 1104a and 1104b and piezoelectric elements 1106a and 1106b are PZT crystal (C5400 or PZT-4 purchased from Channel Industries or Piezo Technologies). Each of piezoelectric elements 1104a and 1104b and piezoelectric elements 1106a and 1106b has a thickness of 0.125 inch, width of 1.0 inch, and length of 2 inch. Piezoelectric element 1104a and piezoelectric element 1106a are positioned symmetrically on one side of inert element 1102 such that a 0.063 inch gap is formed along a center line of inert element 1102. Similarly, piezoelectric element 1104b and 1106b are positioned symmetrically on the other side of inert element 1102 such that a 0.063 inch gap is formed on the center line of inert element 1102. Piezoelectric elements 1104a and 1104b and piezoelectric elements 1106a and 1106b are bonded to inert element 1102 with an epoxy or resin.

Figure 12A:
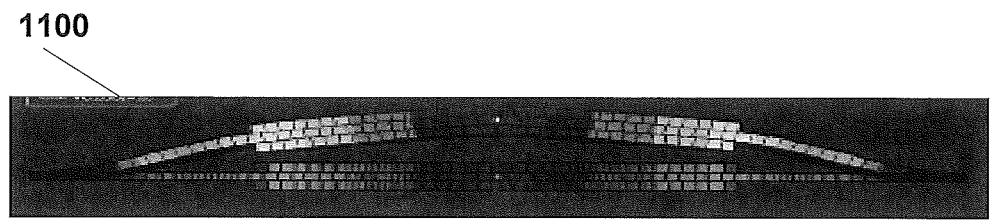
FIGS. 12A, 12B, and 12C illustrate three symmetric mode shapes for the bender bar illustrated in FIG. 11C.
Figure 12B:
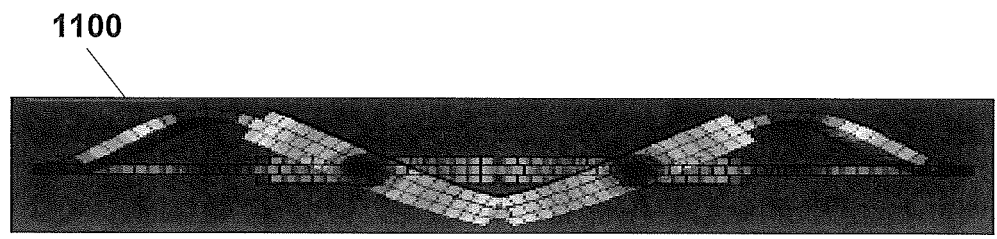
Figure 12C:
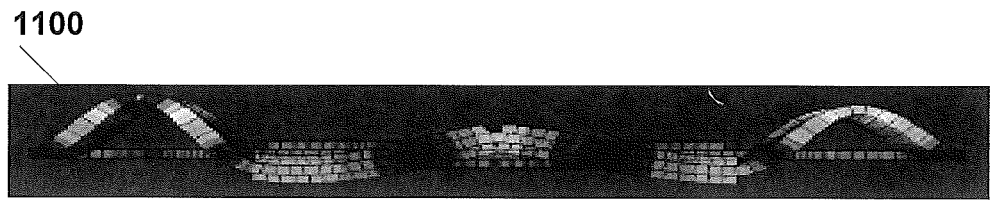

The calculated natural frequencies of bender bar 1100 as illustrated in FIG. 11C with the dimensions described above are shown in Table 3. FIGS. 12A, 12B, and 12C illustrate the three symmetric mode shapes indicated by mode 1 at 352.39 Hz, mode 5 at 2035.7 Hz, and mode 9 at 5654.2 Hz in Table 3. As discussed above, the displacements shown in FIGS. 12A, 12B, and 12C are not to scale.

TABLE 3

| Mode | 1 | 2 | 3 | 4 | 5 | 6 | 7 |
|---|---|---|---|---|---|---|---|
| Freq (Hz) | 352.39 | 967.65 | 1019.1 | 1732.8 | 2035.7 | 4614.2 | 4678.2 |
| Mode | 8 | 9 | 10 | 11 | 12 | 13 | 14 |
| Freq (Hz) | 4732.7 | 5654.2 | 6325.6 | 6778.7 | 7628.5 | 8204.0 | 8967.9 |

Figure 13:
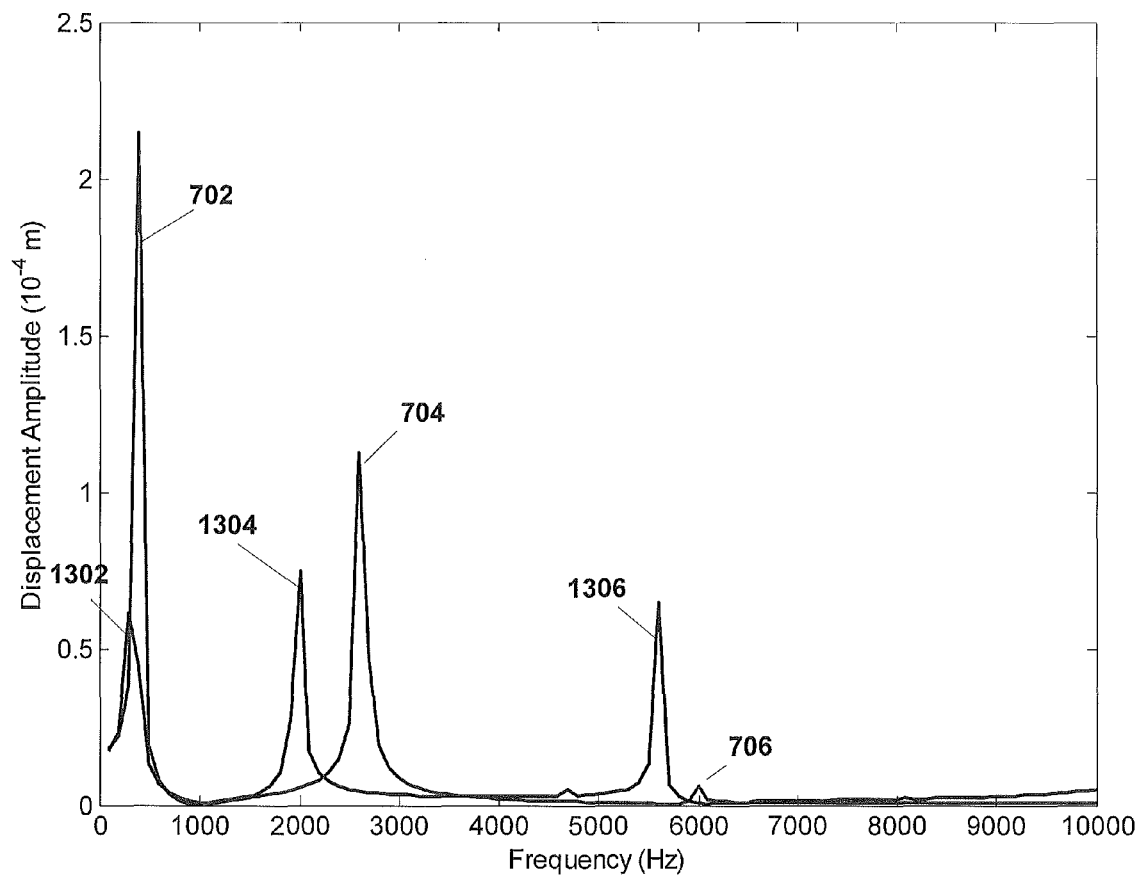
FIG. 13 illustrates a comparison of the harmonic displacement in the Z direction of the bender bar illustrated in FIG. 11C with that of the bender bar illustrated in FIG. 5.

FIG. 13 illustrates the harmonic displacement in Z-direction of the center point of bender bar 1100 illustrated by FIG. 11C in comparison with the harmonic displacement bender bar 100 as illustrated by FIG. 5. As shown in FIG. 13, peak 702 corresponds to mode 1 of bender bar 100, peak 704 corresponds to mode 5 of bender bar 100, and peak 706 corresponds to mode 9 of bender bar 100. The mode frequencies for bender bar 100 are illustrated in Table 1. In comparison, mode 1 of bender bar 1100 results in peak 1302, mode 5 of bender bar 1100 results in peak 1304, and mode 9 of bender bar 1100 results in peak 1306. From these calculated results, it is clear that the split bender bar 1100 shifts lower the natural frequency of the symmetric modes of bender bar 1100 compared to that of the un-split bender bar 100.

FIGS. 14A, 14B, 14C, and 14D illustrate a stacked and split embodiment bender bar 1400. The example embodiment illustrated in FIG. 14A, for example, includes inert element 1410 with multiple layers of piezoelectric elements on each side, arranged such that gaps 1420a and 1420b are formed in the stacked piezoelectric elements at a center line of bender bar 1400. Any number of layers can be utilized. The particular example illustrated in FIG. 14A should not be considered limiting.

Figure 14A:
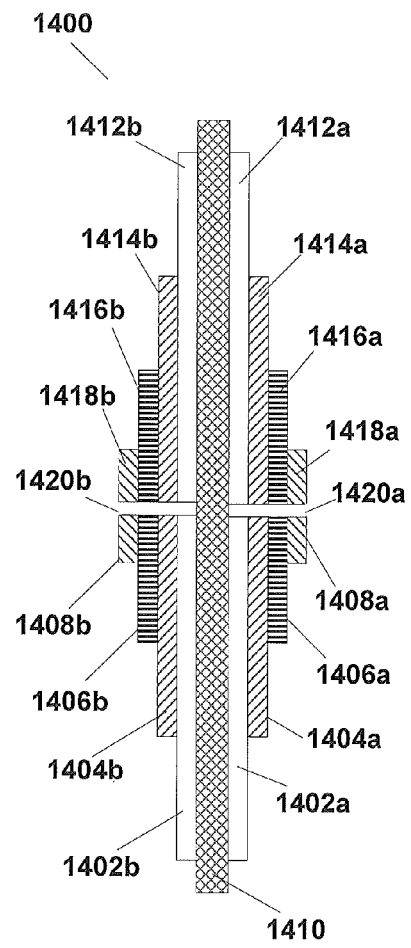
FIGS. 14A, 14B, 14C, and 14D illustrate a stacked bender bar according to some embodiments of the present invention.

As shown in FIG. 14A, piezoelectric elements 1402a and 1402b and piezoelectric elements 1412a and 1412b are bonded to inert element 1410 in such a fashion that a gap 1420a is formed between piezoelectric element 1402a and 1412a and a gap 1420b is formed between piezoelectric element 1402b and 1412b. Piezoelectric element 1402a and 1402b and piezoelectric element 1412a and 1412b can all be of the same size and shape and are positioned such that loading of inert element 1410 is symmetrical around the center line at gap 1420b and 1420a.

Similarly, piezoelectric elements 1404a is bonded on piezoelectric element 1402a, piezoelectric element 1404b is bonded on piezoelectric element 1402b, piezoelectric element 1414a is bonded on piezoelectric element 1412a, and piezoelectric element 1414b is bonded on piezoelectric element 1412b so that the loading is symmetrical and that the gaps 1420a and 1420b are maintained. Similarly, piezoelectric element 1406a is bonded on piezoelectric element 1404a, piezoelectric element 1416a is bonded on piezoelectric element 1414a, piezoelectric element 1406b is bonded on piezoelectric element 1404b and piezoelectric element 1416b is bonded on piezoelectric element 1414b. Additionally, piezoelectric element 1408a is bonded on piezoelectric element 1406a, piezoelectric element 1418a is bonded on piezoelectric element 1416a, piezoelectric element 1408b is bonded on piezoelectric element 1406b, and piezoelectric element 1418b is bonded on piezoelectric element 1416b. As a consequence, stacks of piezoelectric element are formed on inert element 1410 in such a way that gaps 1420a and 1420b are formed between the piezoelectric elements. In some embodiments, this arrangement adds to the mass loading m of bender bar 1400, it does not increase the stiffness k, resulting in lowered operating frequencies.

Figure 14B:
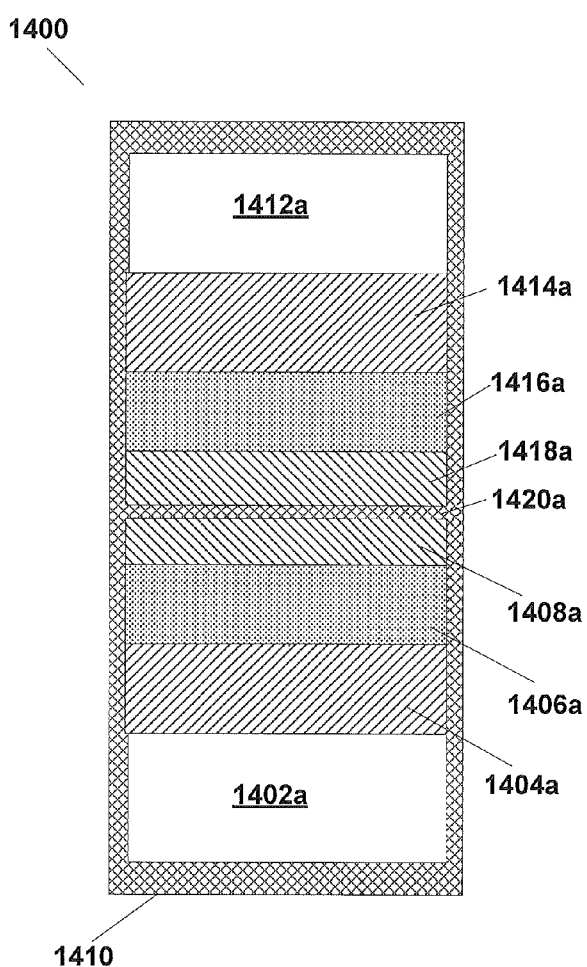

FIG. 14B illustrates some embodiments of bender bar 1400 as illustrated in FIG. 14A, where each of piezoelectric elements 1402a, 1404a, 1406a, and 1408a and piezoelectric elements 1412a, 1414a, 1416a, and 1418a (and correspondingly 1402b, 1404b, 1406b, and 1408b and piezoelectric elements 1412b, 1414b, 1416b, and 1418b) are rectangular and have the same width, but differing lengths. Each layer may also have a different thickness.

Figure 14C:
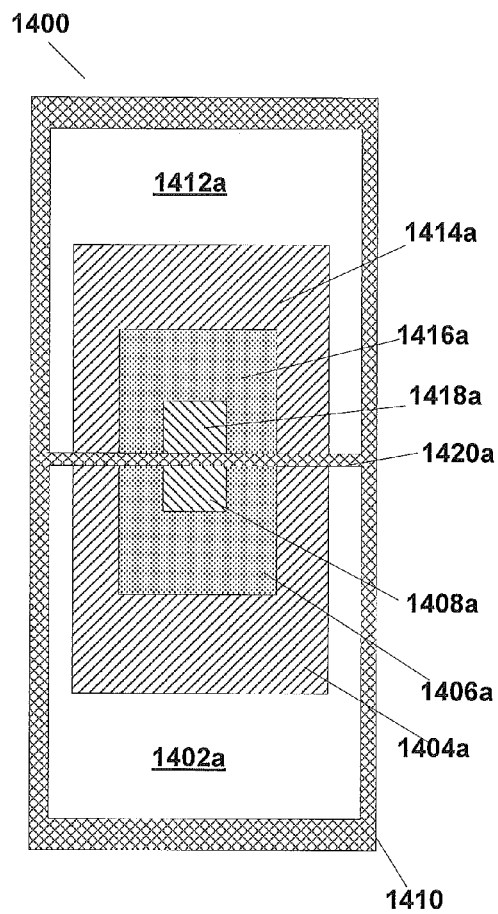

FIG. 14C illustrates some embodiments where each of piezoelectric elements 1402a, 1404a, 1406a, and 1408a and piezoelectric elements 1412a, 1414a, 1416a, and 1418a (and correspondingly 1402b, 1404b, 1406b, and 1408b and piezoelectric elements 1412b, 1414b, 1416b, and 1418b) are rectangular and have differing widths and lengths. Again, thicknesses may differ between layers.

Figure 14D:
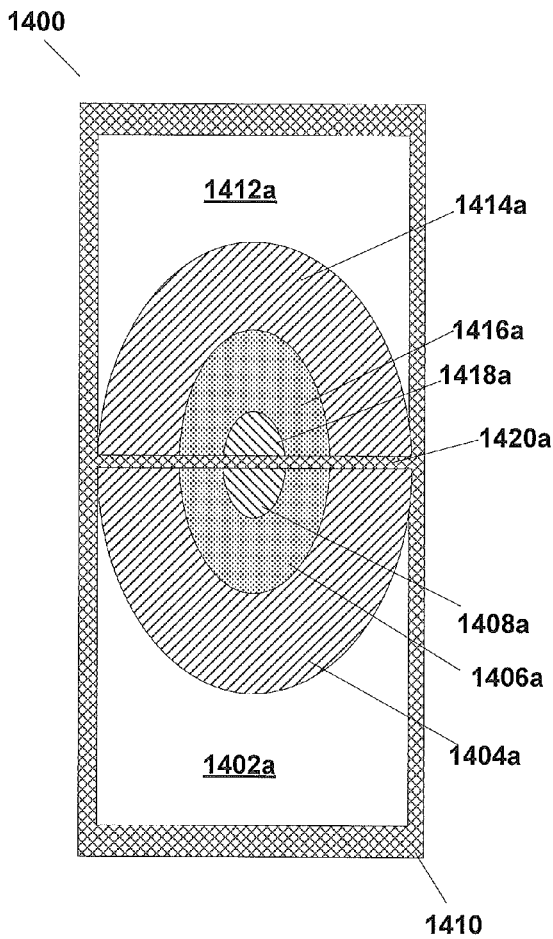

FIG. 14D illustrates some embodiments where each of piezoelectric elements 1402a and 1412a (and correspondingly 1402b and 1412b) are rectangular and piezoelectric elements 1404a, 1406a, and 1408a and piezoelectric elements 1412a, 1414a, 1416a, and 1418a (and correspondingly 1404b, 1406b, and 1408b and piezoelectric elements 1414b, 1416b, and 1418b) are semi-elliptical slabs and of differing major and minor axis lengths. In such case, piezoelectric elements 1404a and 1414a together form a whole ellipse with a cut in the center at gap 1420a; piezoelectric elements 1406a and 1416a form a whole ellipse with a cut in the center at gap 1420a; and piezoelectric elements 1408a and 1418a form a whole ellipse with a cut in the center at gap 1420a. Again, thicknesses may differ between layers.

Figure 15:
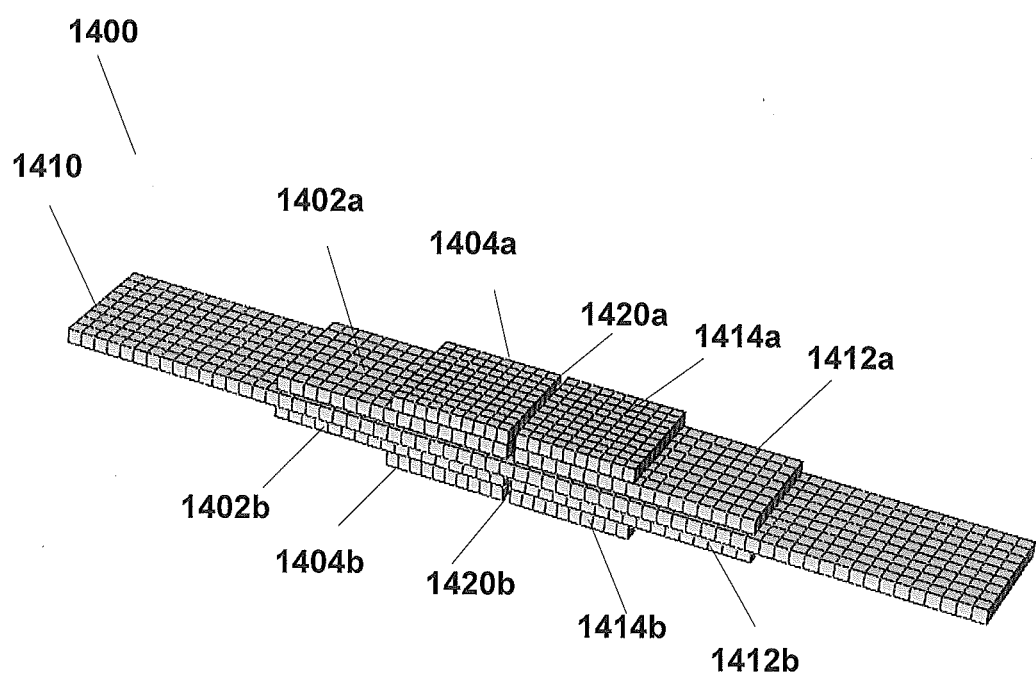
FIG. 15 illustrates a particular example of the bender bar illustrated in FIGS. 14A and 14B.

FIG. 15 illustrates a particular example of bender bar 1400. The particular example of bender bar 1400 of FIG. 15 includes piezoelectric elements 1402a and 1402b, piezoelectric elements 1404a and 1404b, piezoelectric elements 1412a and 1412b, and piezoelectric elements 1414a and 1414b to form a two-layered stack. The results of calculations of the natural frequencies of such a system are provided in Table 4. In that calculation, Inert element 1410 and piezoelectric elements 1402a and 1402b and piezoelectric elements 1412a and 1412b are the same elements and dimensions as inert element 1100 and piezoelectric elements 1104a and 1104b and piezoelectric elements 1106a and 1106b illustrated in FIG. 5. In other words, inert element 1410 is a brass plate of thickness 0.125 inch, length 7.7 inch, and width 1.1 inch. Piezoelectric elements 1402a, 1402b, 1404a, 1404b, 1412a, 1412b, 1414a, and 1414b are PZT crystal (C5400 or PZT-4, which can be purchased, for example, from Channel Industries or Piezo Technologies). Each of Piezoelectric elements 1402a and 1402b and piezoelectric elements 1412a and 1412b has a thickness of 0.125 inch, width of 1.0 inch, and length of 2 inches. Piezoelectric elements 1402a and 1412a and piezoelectric elements 1402b and 1412b are positioned to form gap 1420a and 1420b, respectively, of width 0.03 inch. Piezoelectric elements 1402a and 1402b and piezoelectric elements 1412a and 1412b are bonded to inert element 210 by an epoxy or resin. Piezoelectric elements 1404a and 1404b and piezoelectric elements 1414a and 1414b have thickness of 0.125 inch, width of 1.0 inch, and length of 1 inch. Piezoelectric elements 1404a and 1414a and piezoelectric elements 1404b and 1414b are positioned to form gaps 1420a and 1420b, respectively, of width 0.03 inch. Piezoelectric elements 1404a and 1404b are bonded to piezoelectric elements 1402a and 1402b, respectively, by epoxy or resin. Piezoelectric elements 1414a and 1414b are bonded to piezoelectric elements 1412a and 1412b, respectively, by epoxy or resin.

Figure 16A:
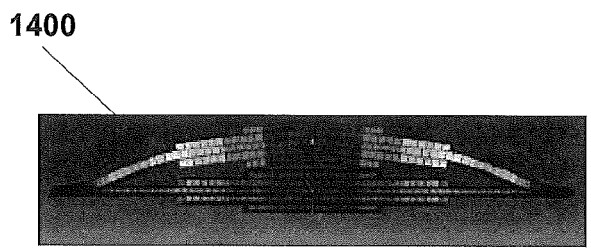
FIGS. 16A, 16B, and 16C illustrate the three symmetric mode of a stacked bender bar illustrated in FIG. 15.
Figure 16B:
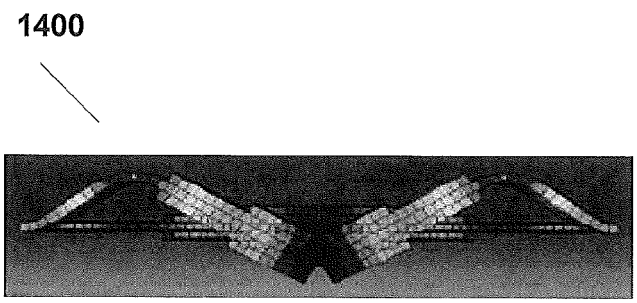
Figure 16C:
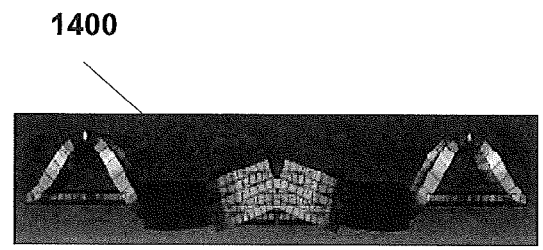
Figure 17:
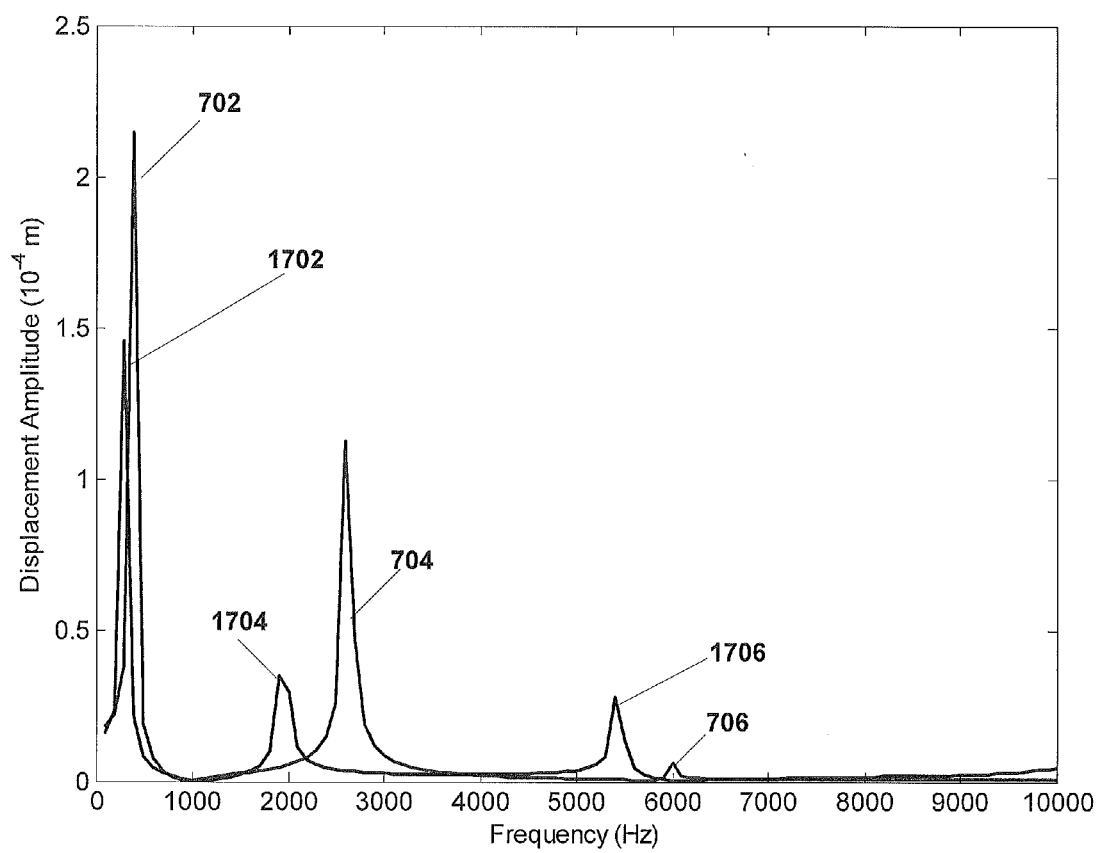
FIG. 17 illustrates a comparison of the harmonic displacement in the Z direction of the bender bar illustrated in FIG. 15 with that of the bender bar illustrated in FIG. 5.

The results of the calculation on bender bar 1400 as illustrated in FIG. 15 (e.g., a stacked and split bender bar) are shown in Table 4. Illustrates of the first three symmetric modes, modes 1, 5, and 8, are illustrated in FIGS. 16A, 16B, and 16C, respectively. FIG. 17 illustrates a comparison of the frequencies of modes 1, 5, and 8 of bender bar 1400 with those of bender bar 100 as illustrated in FIG. 5. As shown in FIG. 17, mode 1 at 321.08 Hz is illustrated as peak 1702, mode 5 at 2013.6 Hz is illustrated as peak 1704, and mode 8 at 5500.7 Hz is illustrated as peak 1706.

TABLE 4

| No. | 1 | 2 | 3 | 4 | 5 | 6 | 7 |
|---|---|---|---|---|---|---|---|
| Freq (Hz) | 321.08 | 860.71 | 942.09 | 1527.0 | 2013.6 | 4526.3 | 4862.2 |
| No. | 8 | 9 | 10 | 11 | 12 | 13 | 14 |
| Freq (Hz) | 5500.7 | 5549.3 | 5765.5 | 6741.5 | 8305.7 | 8670.3 | 8984.4 |

Figure 18:
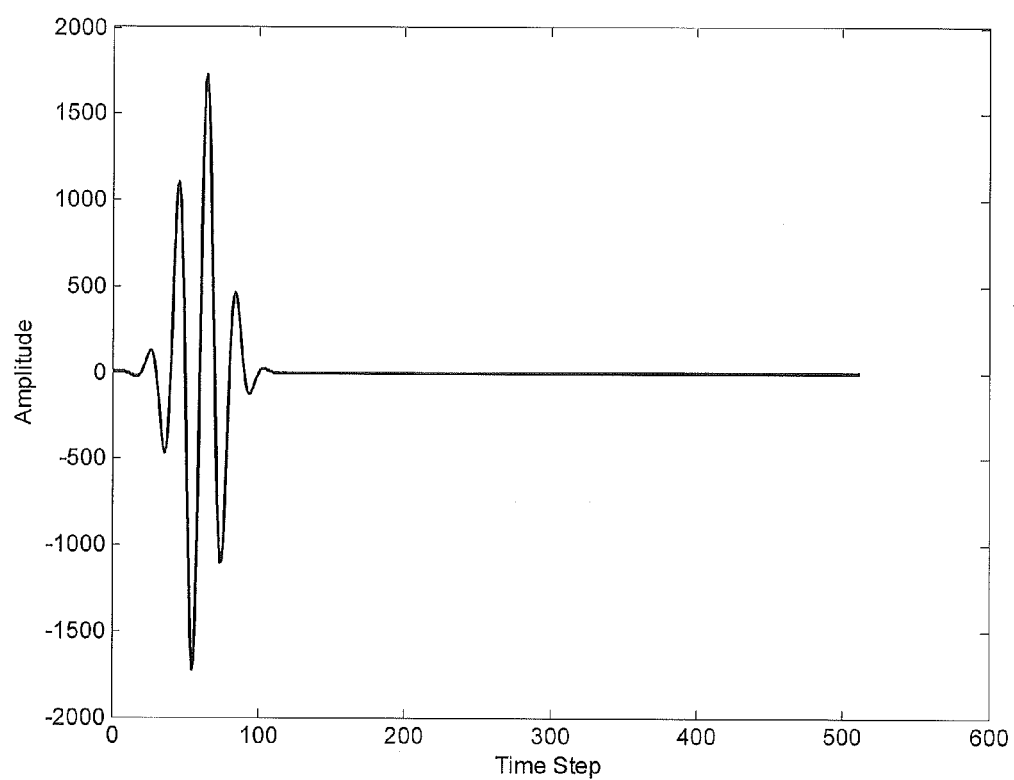
FIG. 18 illustrates a narrow band pulse for driving the PZT elements.

FIG. 18 illustrates a narrow band pulse for driving piezoelectric elements with different center frequency. The main objective is to study the displacement of the mid-point of the bender element. Note that, since there is no loading of the system, the response would be dominated by the harmonic displacements as described in static models discussed above. To show the effects of the multiple driving pulse shapes in different PZT type piezoelectric elements, we use 1000 Hz and 750 Hz narrow pulses with different voltages applied to the stacked elements. The results are shown in the FIG. 19. As such, the waveform illustrated in FIG. 18 was applied to the piezoelectric elements of the bender bars in the above identified calculations.

Figure 19:
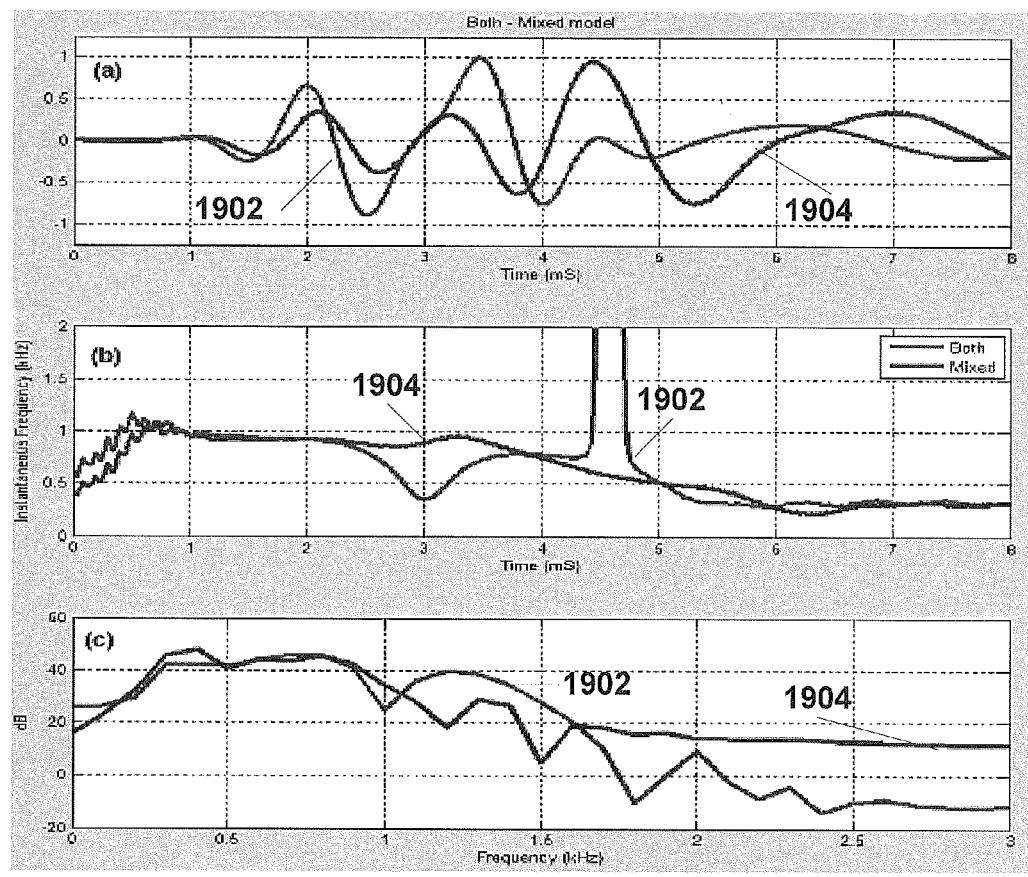
FIG. 19 illustrates the effects of the multiple driving pulse shapes in different PZT elements.

FIG. 19 illustrates dynamic modeling results between driving stacked element with the same driving pulses 1902 with 1000 Hz center frequency and different driving pulses 1904 (1000 Hz pulse applied to the longer PZT element and 750 Hz to the shorter PZT element of bender bar 200 of FIG. 8). As shown in FIG. 19, plot (a) indicates a Time response, plot (b) indicates the Instantaneous frequency (note that there is a spike in the instantaneous frequency for the same driving pulse), and plot (c) indicates the frequency response.

The results indicated in FIG. 19 show that the two different driving pulse shapes change the output responses. Note that these results are used only for two stacked elements. Multiple elements with different driving pulses could produce even better preferred responses. In summary, the controlled driving voltages and pulse shapes with multiple PZT elements could provide a desired response that is proposed in this discloser.

The above detailed description is provided to illustrate specific embodiments of the present invention and is not intended to be limiting. Numerous variations and modifications within the scope of the present invention are possible. The present invention is set forth in the following claims.

What is claimed is:

1. A bender bar, comprising:
    an inert element having a length, width and thickness, the inert element further having a first side and a second side;
    a first pair of piezoelectric elements, wherein one of the first pair of piezeoelectric elements is bonded to the first side and one of the first pair of piezoelectric elements is bonded to the second side;
    a second pair of piezoelectric elements, wherein each of the piezoelectric elements of the second pair are bonded to one of the piezoelectric elements of the first pair;
    wherein one of the piezoelectric elements of the second pair is bonded to the first side of the inert element in relation to one of the first pair in such a way that a first gap is formed between the piezoelectric element of the first pair and the piezoelectric element of the second pair;
    wherein one of the piezoelectric elements of the second pair is bonded to the second side of the inert element in relation to one of the first pair in such a way that a second gap is formed between the piezoelectric element of the first pair and the piezoelectric element of the second pair;
    a third pair of piezoelectric elements, each of the third pair of piezoelectric elements being bonded to one of the first pair of piezoelectric elements;
    a fourth pair of piezoelectric elements, each of the fourth pair of piezoelectric elements being bonded to one of the second pair of piezoelectric elements such that the first gap and the second gap are maintained;
    a driver circuit coupled to each pair of piezoelectric elements to independently drive each of the pair;
    wherein the first pair of piezoelectric elements are bars of width less than or equal to the width of the inert element and a length less than or equal to the length of the inert element; and
    wherein the second pair of piezoelectric elements are bars of width less than or equal to the width of the piezoelectric elements of the first pair and length less than the length of the piezoelectric elements of the first pair.

2. The bender bar of claim 1, wherein the first and second pairs of piezoelectric elements are arranged in a symmetrical fashion with respect to the inert element.

3. The bender bar of claim 1, wherein the third pair and the fourth pair are each bars of piezoelectric material with width less than or equal to that of the first pair and the second pair and lengths less than the first pair and the second pair.

4. The bender bar of claim 1, wherein the third pair and the fourth pair are each partial elliptical slabs such that one element of the third pair and one element of the fourth pair form an ellipse with a major axis and a minor axis, the minor axis being less than or equal to the width of the first pair and the major axis being less than the length of the combination of the length of one element of the first pair, a width of the first gap, and the length of one element of the second pair.

5. The bender bar of claim 1, further including
    sensors coupled to provide feedback signals to the driver circuit,
    wherein the driver circuit adjusts at least the phase between driving voltages applied to each pair of the at least two pairs of piezoelectric elements in response to the feedback signals.

6. The bender bar of claim 1, further comprising a driver circuit to independently drive each pair of the piezoelectric elements with controlled pulses by controlling a frequency, amplitude or shape of the pulses for each pair of the piezoelectric elements based on at least one of a thickness of the piezoelectric elements, a stiffness k, and mass m of the bender bar, to thereby generate symmetric bending modes with a harmonic displacement in a Z-direction of a center point of the bender bar.

7. The bender bar of claim 1, wherein the first and second gaps are positioned substantially at a center line of the inert element.

8. A method of adjusting a frequency response of a bender bar, comprising:
    arranging a first and second pair of piezoelectric elements on an inert element having a length, width, and thickness, the inert element further having a first side and a second side;
    attaching one of the first pair of piezoelectric elements on the first side and attaching one of the first pair of piezoelectric elements on the second side;
    attaching each of the second pair of piezoelectric elements to one of the first pair of piezoelectric elements; and
    independently applying driving voltages to the first and second pairs of piezoelectric elements;
    wherein one of the piezoelectric elements of the second pair is bonded to the first side of the inert element in relation to one of the first pair in such a way that a first gap is formed between the piezoelectric element of the first pair and the piezoelectric element of the second pair;
    wherein one of the piezoelectric elements of the second air is bonded to the second side of the inert element in relation to one of the first air in such a way that a second is formed between the piezoelectric element of the first pair and the piezoelectric element of the second pair;
    attaching a third pair of piezoelectric elements, each of the third pair of piezoelectric elements being bonded to one of the first pair of piezoelectric elements;
    attaching a fourth pair of piezoelectric elements, each of the fourth pair of piezoelectric elements being bonded to one of the second pair of piezoelectric elements such that the first gap and the second gap are maintained; and
    wherein the second pair of piezoelectric elements are bars of width less than or equal to a width of the piezoelectric elements of the first pair and length less than a length of the piezoelectric elements of the first pair.

9. The method claim 8, wherein arranging the at least two pairs of piezoelectric elements includes arranging the elements in a symmetrical fashion with respect to the inert element.

10. The method of claim 8, further including:
    receiving a feedback signal; and
    adjusting the driving voltages in response to the feedback signal.

11. The method of claim 8, further comprising independently driving each pair of the piezoelectric elements with controlled pulses by controlling a frequency, amplitude or shape of the pulses for each pair of the piezoelectric elements based on at least one of a thickness of the piezoelectric elements, a stiffness k, and mass m of the bender bar, to thereby generate symmetric bending modes with a harmonic displacement in a Z-direction of a center point of the bender bar.

12. The method of claim 8, wherein the first and second gaps are positioned substantially at a center line of the inert element.

* * * * *

UNITED STATES PATENT AND TRADEMARK OFFICE
CERTIFICATE OF CORRECTION

PATENT NO. : 9,541,657 B2
APPLICATION NO. : 13/821847
DATED : January 10, 2017
INVENTOR(S) : Batakrishna Mandal et al.

It is certified that error appears in the above-identified patent and that said Letters Patent is hereby corrected as shown below:

In the Claims

In Column 14, Line 31: please replace "air" with --pair--;
In Column 14, Line 32: please replace "air" with --pair--.

Signed and Sealed this
Fourteenth Day of March, 2017

Michelle K. Lee
*Director of the United States Patent and Trademark Office*